United States Patent
Jung

(10) Patent No.: US 6,835,532 B2
(45) Date of Patent: Dec. 28, 2004

(54) ORGANIC ANTI-REFLECTIVE COATING COMPOSITION AND METHOD FOR FORMING PHOTORESIST PATTERNS USING THE SAME

(75) Inventor: Jae-chang Jung, Seoul-shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 98 days.

(21) Appl. No.: 10/357,876

(22) Filed: Feb. 4, 2003

(65) Prior Publication Data

US 2003/0235784 A1 Dec. 25, 2003

(30) Foreign Application Priority Data

Jun. 24, 2002 (KR) ........................................ 2002-35361

(51) Int. Cl.[7] ............................................... G03C 1/492
(52) U.S. Cl. ..................... 430/271.1; 430/325; 430/905
(58) Field of Search ............................. 430/271.1, 325, 430/905

(56) References Cited

U.S. PATENT DOCUMENTS

| | | | |
|---|---|---|---|
| 5,474,877 A | 12/1995 | Suzuki | |
| 5,886,102 A | 3/1999 | Sinta et al. | |
| 6,110,653 A | * 8/2000 | Holmes et al. | ............. 430/325 |
| 6,114,085 A | 9/2000 | Padmanaban et al. | |
| 6,251,562 B1 | 6/2001 | Breyta et al. | |
| 6,261,743 B1 | 7/2001 | Pavelchek et al. | |
| 6,528,235 B2 | 3/2003 | Thackeray et al. | |
| 6,653,049 B2 | 11/2003 | Pavelchek et al. | |
| 2002/0132184 A1 | 9/2002 | Babcock | |
| 2003/0215736 A1 | * 11/2003 | Oberlander et al. | ..... 430/270.1 |
| 2004/0101779 A1 | * 5/2004 | Wu et al. | ................ 430/271.1 |

FOREIGN PATENT DOCUMENTS

GB        2363798 A        9/2002

* cited by examiner

*Primary Examiner*—Rosemary Ashton
(74) *Attorney, Agent, or Firm*—Marshall, Gerstein & Borun LLP

(57) ABSTRACT

An organic anti-reflective coating composition and a method for forming photoresist patterns using the same are disclosed which can prevent reflection of the lower film layer or substrate and reduce standing waves caused by light and variation of in the thickness of the photoresist itself, thereby, increasing uniformity of the photoresist pattern, with respect to a microfine pattern-forming process using photoresists for a photolithography by using ArF with 193 nm wavelength among processes for manufacturing semiconductor device. More particularly, an organic anti-reflective coating composition and a method for forming photoresist patterns using the same are disclosed which can obtain perpendicular photoresist patterns and thus inhibit breakdown and/or collapse of the patterns by comprising an acid-diffusion inhibitor.

19 Claims, 2 Drawing Sheets

ORGANIC ANTI-REFLECTIVE COATING COMPOSITION AND METHOD FOR FORMING PHOTORESIST PATTERNS USING THE SAME

BACKGROUND

1. Technical Field

An organic anti-reflective coating composition and a method for forming photoresist patterns using the same are disclosed which can prevent reflection of the lower film layer or substrate and reduce standing waves caused by light and the variation in the thickness of the photoresist itself, thereby, increasing uniformity of the photoresist pattern, with respect to a microfine pattern-forming process using photoresists for a photolithography by using ArF with 193 nm wavelength among processes for manufacturing semiconductor devices. More particularly, an organic anti-reflective coating composition and a method for forming photoresist patterns using the same are disclosed which can obtain perpendicular photoresist patterns and thus inhibit breakdown and/or collapse of the patterns by comprising an acid-diffusion inhibitor.

2. Description of the Related Art

It is known in microfine pattern-forming process among conventional semiconductor production processes that standing waves caused by optical properties of lower film layers, that is, the substrate of a photoresist film and/or alteration of the thickness of a photosensitive film, reflective notching, and/or variation of the critical dimension (hereinafter referring to as "CD") of the photoresist pattern derived from diffracted light and reflective light emitted from the substrate inevitably occur. Accordingly, proposed is the introduction of a layer for protecting the reflection on the substrate between the substrate and the photoresist by introducing materials with excellent light-absorbing ability within wavelength ranges of exposure light sources, the protecting layer being called an anti-reflective film. The anti-reflective film may be generally classified as inorganic or organic based anti-reflective films based on the types of materials used.

In recent years, the organic anti-reflective films are has been used in the microfine pattern-forming processes using ArF with a 193 nm wavelength and compositions for the same need to satisfy the requirements as follows:

(1) After lamination of the anti-reflective film and during the process for coating the photoresist above the film, the film should continuously remain without dissolving in the solvent for the photoresist. For this, the film must be designed to have cross-linking structures during lamination of the film by coating the film and then progressing a baking process and, at the same time, to inhibit generation of other chemical materials as by-products;

(2) In order to prevent scattered reflection from the substrate, the film must contain certain materials to absorb light within the wavelength range of exposure to the light source; and (3) The lamination process of the anti-reflective coating composition requires a particular catalyst to activate the cross-linking reaction.

In order to accomplish the above requirements, conventional organic anti-reflective coating compositions generally comprised of a cross-linking agent to allow the anti-reflective film to have the cross-linking structure; a light-absorbing agent to absorb the light at the wavelength range of exposure to the light source; and a thermal acid generator as catalyst for activating the cross-linking reaction.

In particular, as the organic anti-reflective coating composition used in the microfine pattern-forming process using an ArF light source, mostly used is polyvinylphenol as the light-absorbing agent having a structure represented by following Formula 1 which absorbs the 193 nm light. The polymer may react with the developer generally used in the photoresist pattern-forming process to generate the thermal acid, by which undercutting may occur on the lower portion of the photoresist pattern resulting in a poor inverted trapezoidal pattern instead of the desired perpendicular pattern.

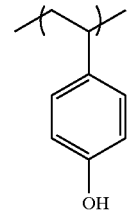

Formula 1

Moreover, if such an inverted trapezoidal pattern is formed, it may cause a problem in that the pattern is collapsed and, when material such as polyvinylphenol is adapted as the light-absorbing agent in the microfine pattern forming process using another light source, the same difficulties may occur, even for the process for forming the microfine pattern using another light source.

Accordingly, there is still a demand for improved organic anti-reflective coating compositions making it possible to provide preferable perpendicular photoresist patterns, and protecting the patterns from being collapsed, and a method for forming photoresist patterns using the same.

SUMMARY OF THE DISCLOSURE

An improved organic anti-reflective coating composition is disclosed which can protect acid generated by the reaction of a developer with a light-absorbing agent from being dispersed toward lower portions of the photoresist, thereby obtaining a perpendicular and excellent photoresist pattern by comprising an acid-diffusion inhibitor in addition to the anti-reflective coating composition.

A method for forming photoresist patterns using said organic anti-reflective coating composition is disclosed which can obtain perpendicular photoresist patterns and thus inhibit breakdown and/or collapse of the patterns.

A disclosed organic anti-reflective coating composition comprises: a cross-linking agent to provide the formed anti-reflective film with a cross-linkage structure; a polyvinylphenol polymer having a structure of following Formula 1 used as a light-absorbing agent; a thermal acid generator; an organic solvent; and an acid-diffusion inhibitor.

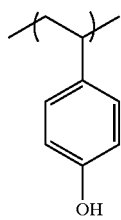

Formula 1

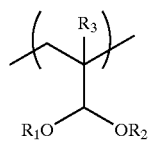

Formula 3 wherein $R_1$ and $R_2$ are each independently branched and/or linear chain substituted $C_1$–$C_{10}$ alkyl group; and $R_3$ is a hydrogen or methyl group.

The polymer of above Formula 3 reacts with polyvinylphenol which is used as a light-absorbing agent capable of cross-linking by the reaction of alcohol in the presence of acid, thereby forming the cross-linking bond. Such a cross-linking bond prevents the formed organic anti-reflective film from dissolving in the photoresist solvent. The polymer can be obtained by polymerizing (meth)acroleins to prepare poly(meth)acroleins, thereafter, making the resulting materials reacted with the branched chain and/or main chain substituted $C_1$–$C_{10}$ alkylalcohol. Such a polymer and practical preparation thereof have been disclosed in Korean Patent Applications No. 99-61343 (laid-open on Jul. 5, 2001) and No. 99-61344 (laid-open on Jul. 5, 2001), both of which were filed on Dec. 23, 1999 by the present applicant.

Such an organic anti-reflective coating composition comprises the acid-diffusion inhibitor, in which the acid-diffusion inhibitor inhibits the acid generated from the reaction between a developer and the polyvinylphenol polymer used as the light-absorbing agent from being dispersed toward the lower portion of the photoresist pattern, in turn, preventing undercutting for the photoresist pattern and, therefore, forming favorable perpendicular photoresist patterns and protecting the patterns from collapsing.

The disclosed organic anti-reflective coating composition may preferably comprise a crown ether based compound as the acid-diffusion inhibitor, more preferably, 18-crown-6(1, 4, 7, 10, 13, 16-hexaoxacyclooctadecane) having the structure as in the following Formula 2:

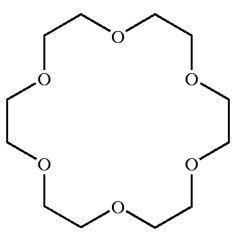

Formula 2

Said crown ether based compound is a compound with a crown-like circular structure as represented by the above Formula 2 and contains oxygen atoms within the circular structure. Since the oxygen atoms may optionally interact with certain cations matching the size of the cavity in the center portion of the circular structure in the organic solvent, acid-diffusion toward the lower portion of the photoresist can be prevented by the interaction between such crown based ether and the acid, even when generating the acid by reaction of the developer and the polyvinylphenol during formation of the photoresist pattern.

In a disclosed embodiment of the anti-reflective coating composition, such a cross-linking agent may generally include materials used as the cross-linking agents in conventional organic anti-reflective coating compositions, however, for the microfine pattern-forming process using an ArF light source, preferably used are acetal based compounds, more preferably, polymers having structure of the following Formula 3. Such polymers have a molecular weight ranging from about 3000 to about 100000 usually suitable for cross-linking polymers applied to the composition.

In another disclosed embodiment of the coating composition, the polyvinylphenol polymer has been proposed as the light-absorbing agent before the present invention and the production method and use of a light-absorbing agent thereof are well known and easily preformed by those skilled in the art to which the present invention pertains.

In still another disclosed embodiment of the coating composition, the thermal acid generator may generally include conventional thermal acid generators, more preferably, 2-hydroxyhexyl p-toluenesulfonate having structure of the following Formula 4:

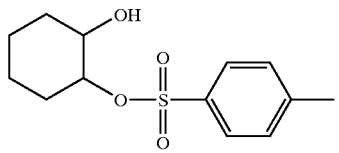

Formula 4

As described above, the thermal acid generator is for activating the cross-linking reaction between the cross-linking agent and the light-absorbing agent.

The organic anti-reflective film which does not dissolve in the solvent of photoresist can be formed by first coating such thermal acid generator on the wafer of semiconductor device and/or element then conducting a heating process such as baking to generate acid from the thermal acid generator and, in turn, induce the cross-linking reaction described above under the presence of the resulting acid.

For a disclosed organic anti-reflective coating composition, the polyvinylphenol polymer of Formula 1 used as the light-absorbing agent may be preferably contained in an amount ranging from about 50 to about 400% by weight based on the total amount of such cross-linking agent included in the present composition; while the thermal acid generator is preferably contained in an amount ranging from about 10 to about 200% by weight relative to the amount of the cross-linking agent. In addition, the organic solvent is preferably contained in an amount of ranging from about 1000 to about 10000% by weight based on total amount of the cross-linking agent and light-absorbing agent included in the present composition while the acid-diffusion inhibitor is preferably in an amount ranging from about 30 to about 50% by mol relative to the amount of the thermal acid generator included in the composition.

By comprising respective components in such compositions described above, the disclosed organic anti-reflective coating composition can efficiently protect scattered reflection from lower film layer, that is, the substrate of the photoresist film and, at the same time, prevent undercutting of lower portion of the components in the cross-linking reaction, thereby resulting in the excellent perpendicular photoresist patterns.

In another aspect, a disclosed method for forming photoresist patterns comprises: applying a disclosed organic anti-reflective coating composition of the present invention onto the surface of a layer to be etched; conducting a baking process to the resultant material to generate a cross-linking bond and to form an organic anti-reflective film; and coating the photoresist above the formed anti-reflective film, exposing the applied film to light source and then developing the same to form desirable photoresist patterns.

Because the disclosed pattern forming method includes the use of an acid-diffusion inhibitor in the organic anti-reflective coating composition, it will be appreciated that the present method has the advantages of inhibiting generation of acid derived from the light-absorbing agent, polyvinylphenol and the developer during the step of forming photoresist patterns and, hence, preventing undercutting of the lower portion of the photoresist, so that excellent perpendicular photoresist patterns can be obtained.

An embodiment of the pattern-forming method preferably includes a baking process to be conducted at a temperature ranging from about 150 to about 300° C. for a time period ranging from about 1 to about 5 minutes. Under such conditions, acid is generated from the thermal acid generator to form cross-linking bonds within the anti-reflective film and, thereby, to produce the desired anti-reflective film which will not dissolve in the solvent of the photoresist.

Moreover, in accordance with the method disclosed above, the baking process can be additionally conducted before and/or after the exposure process during the step of forming the photoresist pattern and, preferably at a temperature ranging from about 70 to about 200° C.

It will be appreciated that the organic anti-reflective coating composition and photoresist pattern-forming method using the same can be applied in particular microfine pattern-forming processes using KrF, deep-ultraviolet (DUV) including EUV, E-beam, X-ray or ion beam, although they are generally employed in the microfine pattern-forming process using an ArF light source.

A semiconductor device produced using the photoresist pattern-forming method described above is also disclosed.

BRIEF DESCRIPTION OF THE DRAWINGS

The above and other aspects of the disclosed compositions and methods will become apparent from the following description of the embodiments with reference to the accompanying drawings wherein.

DETAILED DESCRIPTION OF THE PRESENTLY PREFERRED EMBODIMENTS

The disclosed compositions and methods will be described in more detail with reference to the following example and comparative example which is presented for the purpose of illustration and should not be construed to limit the scope of this disclosure.

Comparative Example

Preparation of the Organic Anti-Reflective Film and Formation of the Photoresist Pattern by the Conventionally Known Method To 13 g of propyleneglycol methyletheracetate solvent, 0.13 g of cross-linking agent of following Formula 5, 0.26 g of polyvinylphenol of Formula 2 and 0.085 g of thermal acid generator of Formula 3 represented above were added and dissolved, then the resulting mixture was filtered through a 0.2 μm fine filter to prepare the organic anti-reflective coating composition. The obtained composition was spin-coated on a silicon wafer, baked at 240° C. for 90 seconds to generate cross-linking bonds and, thereby forming the intended anti-reflective film. Afterward, an additional backing process was performed to the resultant anti-reflective film at 120° C. for 90 seconds after coating the film with photoresist available from and manufactured by Clariant Corp., which has the trade name of AX1020P widely known as a photoresist material. After the baking process, the obtained material was exposed to light by means of ArF exposure apparatus manufactured by ASML and further baked at 120° C. for 90 seconds. To the exposed wafer, a developing process was performed in 2.38% by weight aqueous TMAH developer solution to obtain patterns shown in FIG. 1.

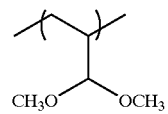

Formula 5

EXAMPLE

Preparation of the Disclosed Organic Anti-Reflective Film and Formation of Photoresist Pattern Using the Same To 13 g of propyleneglycol methyletheracetate solvent, 0.13 g of cross-linking agent of the above Formula 5, 0.2275 g of polyvinylphenol of Formula 2 and 0.085 g of thermal acid generator of Formula 3 represented above, and acid-diffusion resistant agent, that is, 18-crown-6 were added and dissolved, then the resulting mixture was filtered through a 0.2 μm fine filter to prepare the organic anti-reflective coating composition. The obtained composition was processed according to the procedure in the above comparative example to form the desired anti-reflective film and to obtain photoresist patterns shown in FIG. 2.

Figure 1:
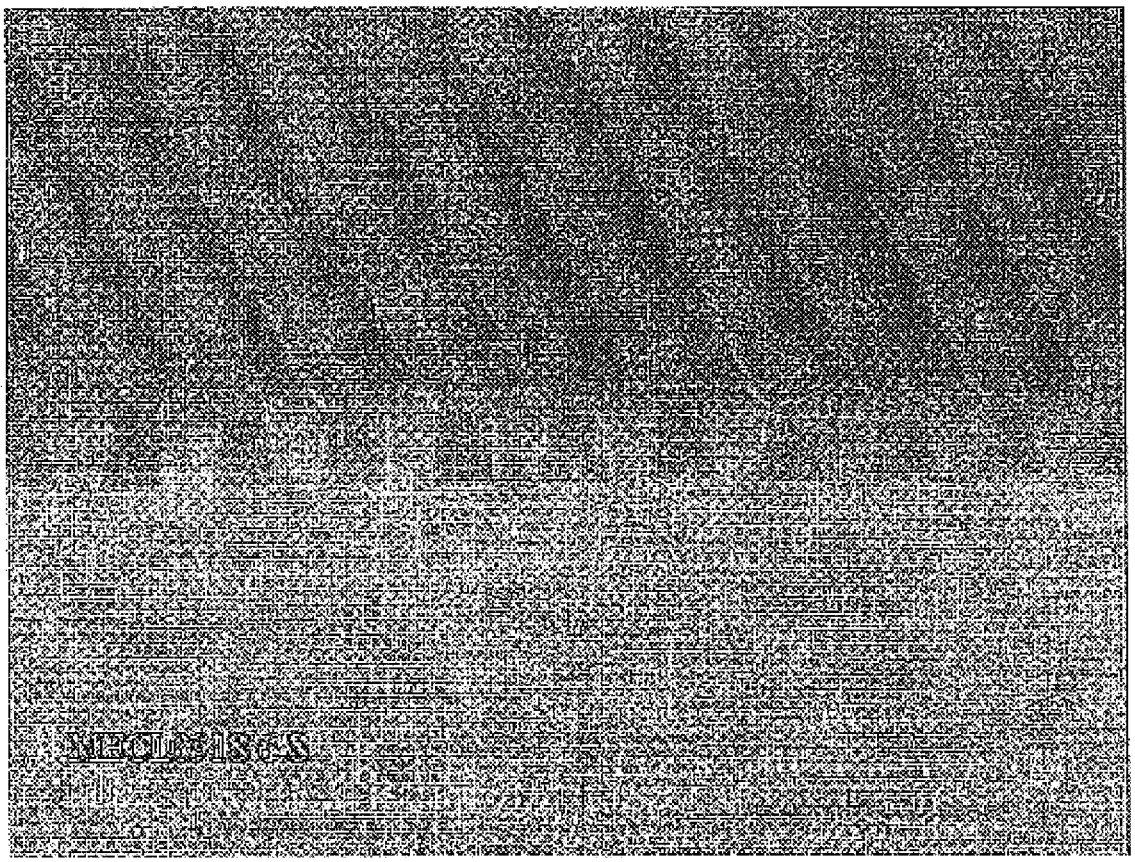
FIG. 1 shows a photoresist pattern formed by a conventional organic anti-reflective coating composition.
Figure 2:
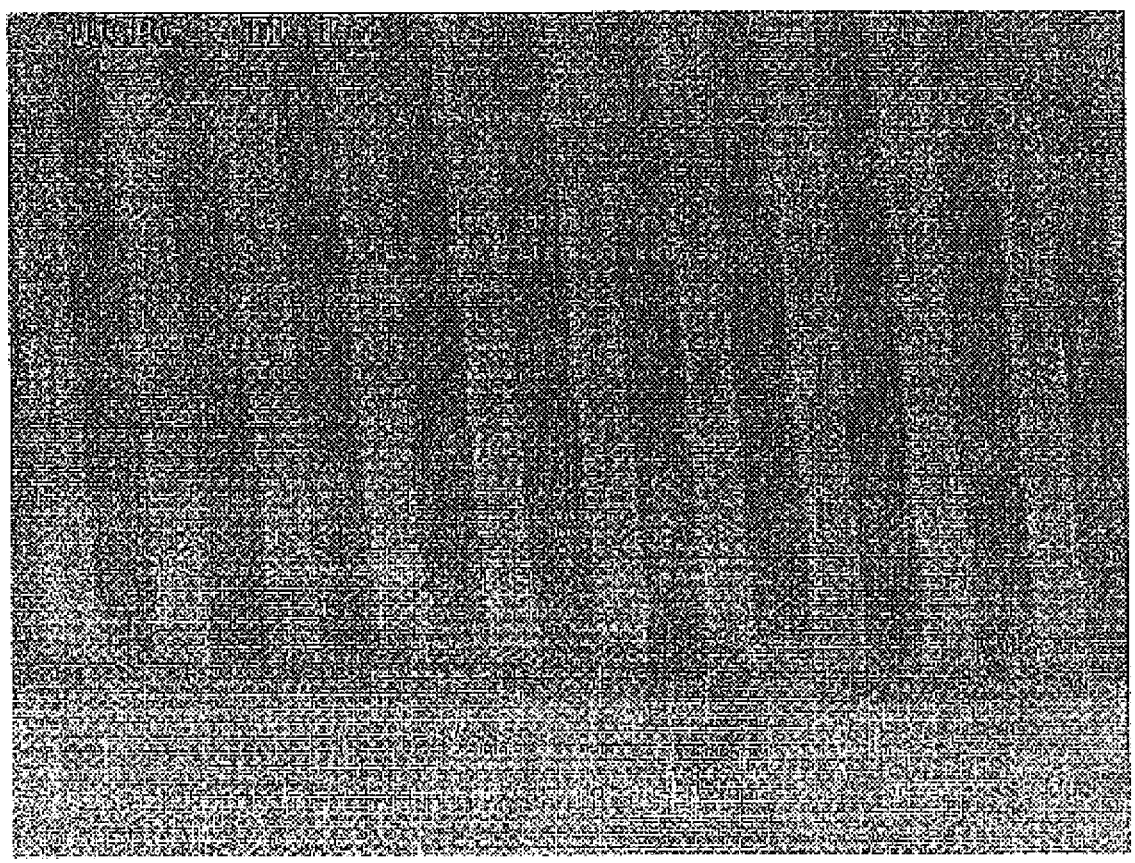
FIG. 2 shows a photoresist pattern formed by a disclosed organic anti-reflective coating composition.

As illustrated in FIGS. 1 and 2, it was found that the excellent perpendicular photoresist pattern can be obtained by using the anti-reflective coating composition, while poorly inverted trapezoidal patterns having possible collapsed areas thereon were formed by the conventional method.

As clear from the above description, the disclosed organic anti-reflective coating composition can be used to produce excellent perpendicular photoresist patterns and, at the same time, to inhibit occurrence of poorly inverted trapezoidal patterns by undercutting lower portion of the pattern due to acid generated from reaction of the light-absorbing agent and developer contained in the coating composition.

To summarize, the disclosed composition and method can reduce and/or protect pattern collapse which often occurs in known poorly inverted trapezoidal patterns and, in addition, exhibit increased production yield of products and industrial effect in microfine pattern-forming processes for semiconductor devices.

It is further understood by those skilled in the art that the forgoing description is a preferred embodiment and that various changes and modifications may be made without departing from the spirit and scope thereof.

What is claimed is:

1. An organic anti-reflective coating composition comprising:
    a cross-linking agent to provide anti-reflective film with a cross-linkage structure; a polyvinylphenol polymer having structure of following Formula 1 used as a light-absorbing agent; a thermal acid generator; an organic solvent; and an acid-diffusion inhibitor;

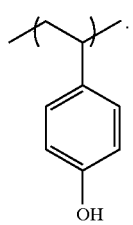

Formula 1

2. The composition according to claim 1, wherein the composition comprises crown ether based compound as the acid-diffusion inhibitor.

3. The composition according to claim 2, wherein the acid-diffusion inhibitor is 18-crown-6(1,4,7,10,13,16-hexaoxacyclooctadecane) having a structure of following Formula 2;

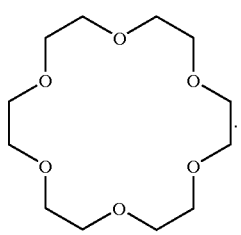

Formula 2

4. The composition according to claim 1, wherein the cross-linking agent comprises polymers having a structure of the following Formula 3 and a molecular weight ranging from about 3000 to about 100000;

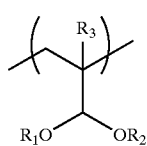

Formula 3 wherein $R_1$ and $R_2$ are each independently branched and/or linear chain substituted $C_1$–$C_{10}$ alkyl group; and $R_3$ is a hydrogen or methyl group.

5. The composition according to claim 1, wherein the thermal acid generator comprises 2-hydroxyhexyl p-toluenesulfonate having structure of the following Formula 4;

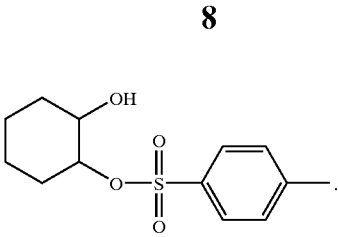

Formula 4

6. The composition according to claim 1, wherein the polyvinylphenol polymer as the light-absorbing agent is contained in an amount ranging from about 50 to about 400% by weight based on an amount of the cross-linking agent included in the composition.

7. The composition according to claim 1, wherein the thermal acid generator is contained in an amount ranging from about 10 to about 200% by weight based on an amount of the cross-linking agent included in the composition.

8. The composition according to claim 1, wherein the organic solvent is contained in an amount ranging from about 1000 to about 10000% by weight based on total amount of the cross-linking agent and light-absorbing agent included in the composition.

9. The composition according to claim 1, wherein the acid-diffusion inhibitor is contained in an amount ranging from about 30 to about 500 mol % based on amount of the thermal acid generator included in the composition.

10. A photoresist pattern-forming method comprising the steps of:
    applying the organic anti-reflective coating composition described in claim 1 onto a surface of a layer to be etched;
    conducting baking process to the resultant material to generate cross-linking bond and to form an organic anti-reflective film; and
    coating the photoresist onto the formed anti-reflective film, exposing the applied film to a light source and then developing the same to form the photoresist pattern.

11. The method according to claim 10, wherein the baking process is performed at a temperature ranging from about 150 to about 300° C. for a time period ranging from about 1 to about 5 minutes.

12. The method according to claim 10, wherein the pattern forming step further comprises an additional baking process before and/or after the exposure process.

13. The method according to claim 12, wherein the baking process is performed at a temperature ranging from about 70 to about 200° C.

14. The method according to claim 10, wherein the light source is selected from the group consisting of ArF, KrF, deep-ultraviolet (DUV) including EUV, E-beam, X-ray and ion beam.

15. A semiconductor device manufactured by the method of claim 10.

16. A semiconductor device manufactured by the method of claim 11.

17. A semiconductor device manufactured by the method of claim 12.

18. A semiconductor device manufactured by the method of claim 13.

19. A semiconductor device manufactured by the method of claim 14.

* * * * *